(12) United States Patent
Calabro et al.

(10) Patent No.: US 8,964,924 B2
(45) Date of Patent: Feb. 24, 2015

(54) METHOD AND DEVICE FOR CLOCK RECOVERY

(75) Inventors: Stefano Calabro, Munich (DE); Peter Kainzmaier, Munich (DE); Bernhard Spinnler, Obernaching (DE)

(73) Assignee: Xieon Networks S.a.r.l., Luxembourg (LU)

( * ) Notice: Subject to any disclaimer, the term of this patent is extended or adjusted under 35 U.S.C. 154(b) by 0 days.

(21) Appl. No.: 13/825,877

(22) PCT Filed: Sep. 24, 2010

(86) PCT No.: PCT/EP2010/064116
§ 371 (c)(1),
(2), (4) Date: Mar. 25, 2013

(87) PCT Pub. No.: WO2012/037981
PCT Pub. Date: Mar. 29, 2012

(65) Prior Publication Data
US 2013/0181757 A1 Jul. 18, 2013

(51) Int. Cl.
*H04L 7/00* (2006.01)
*H04L 25/00* (2006.01)
*H04L 25/40* (2006.01)
*H03L 7/08* (2006.01)

(52) U.S. Cl.
CPC ............ *H03L 7/0807* (2013.01); *H04L 7/0029* (2013.01); *H04L 7/005* (2013.01)
USPC .......................................... 375/371; 375/354

(58) Field of Classification Search
USPC .......................................... 375/371
See application file for complete search history.

(56) References Cited

U.S. PATENT DOCUMENTS

| 6,002,721 | A * | 12/1999 | Said et al. ..................... 375/261 |
| 6,366,629 | B1 * | 4/2002 | Chen et al. ..................... 375/355 |
| 6,430,235 | B1 | 8/2002 | O'Shea et al. |
| 6,560,299 | B1 | 5/2003 | Strolle et al. |

OTHER PUBLICATIONS

ITU-T G.8251 (Nov. 2001) Series G: Transmission Systems and Media, Digital Systems and Networks Digital networks—Quality and availability targets—The control of jitter and wander within the optical transport network (OTN).
ITU-T G.8251 Corrigendum 2 (May 2008) Series G: Transmission Systems and Media, Digital Systems and Networks Packet over Transport aspects—Quality and availability targets—The control of jitter and wander within the optical transport network (OTN) Corrigendum 2.
(Continued)

*Primary Examiner* — Erin File
(74) *Attorney, Agent, or Firm* — Nelson Mullins Riley & Scarborough LLP

(57) ABSTRACT

A method and a device for processing a signal determine a timing phase over an observation interval of an input signal. A frequency estimation is determined based on the timing phase. A phase correction is determined for the observation interval based on the timing phase and the frequency offset. Then the phase correction is used to adjust the timing of the input signal. Also, a communication system with at least one such device is described.

21 Claims, 7 Drawing Sheets

(56) References Cited

OTHER PUBLICATIONS

Jingfeng Liu et al: "Symbol timing recovery for low-SNR partial response recording channels", Globecom'02. 2002—IEEE Global Telecommunications Conference. Conference Proceedings. Taipei, Taiwan, Nov. 17-21, 2002; [IEEE Global Telecommunications Conference], New York, NY: IEEE, US, vol. 2, Nov. 17, 2002, pp. 1129-1136, XP010636322, DOI: DOI:10.11096/GLOCOM.2002.1188372 ISBN: 978-0-7803-7632-8.

Chaoxing Yan et al: "Design and Performance Evaluation of Feedforward Timing Estimator for M-PSK Signals", Wireless Communications, Networking and Mobile Computing, 2009. WICOM '09. 5th International Conference on, IEEE, Piscataway, NJ, USA, Sep. 24, 2009, pp. 1-4, XP031554993, ISBN: 978-1-4244-3692-7.

Maxim Kuschnerov et al: "DSP for Coherent Single-Carrier Receivers", Journal of Lightwave Technology, IEEE Service Center, New York, NY, US, vol. PP, No. 16, Aug. 15, 2009, pp. 3614-3622, XP011262207, ISSN: 0733-8724.

Tilde Fusco et al: "Blind Feedforward Symbol-Timing Estimation With PSK Signals: A Constant-Modulus Approach", IEEE Transactions on Communications, IEEE Service Center, Piscataway, NJ. USA, vol. 55, No. 2, Feb. 1, 2007, pp. 242-246, XP011165706, ISSN: 0090-6778, DOI: DOI:10.1109/TCOMM.2006.888519.

* cited by examiner

METHOD AND DEVICE FOR CLOCK RECOVERY

BACKGROUND OF THE INVENTION

Field of the Invention

The invention relates to a method and to a device for processing a signal, in particular for clock recovery purposes. Also, a communication system with at least one such device is suggested.

Existing optical communication systems use On-Off Keying (OOK) and convey one information bit per signaling interval by modulating the intensity of the transmitted light. Binary phase-shift keying (BPSK) uses two phases which are separated by 180° and as such is a robust PSK modulation scheme that allows an increased performance compared to OOK.

OOK and BPSK systems can be deployed at 10 G and 40 G at a 50 GHz channel spacing. However, at 100 G and beyond, an associated filtering would lead to an unacceptable degradation of the signal. Hence, in order to preserve the compatibility with legacy channel filters and without reducing the number of channels in the amplifier band, the deployment of faster channels requires more spectral-efficient modulation formats, i.e. high-order signal constellations. For instance, single-carrier polarization-multiplexed Quaternary Phase-Shift Keying (also referred to as "polmux-QPSK") is known as a candidate for the deployment of 100 G systems with 50 GHz channel spacing.

By virtue of its simplicity, an incoherent detection is a preferred mechanism in optical communications. In contrast, a coherent detection can be used for high-order constellations, because it provides a significant advantage with regard to sensitivity, allows convenient polarization de-multiplexing and enables digital mitigation of Polarization Mode Dispersion (PMD) and Chromatic Dispersion (CD).

An essential pre-requisite for a reliable digital transmission is the availability of the correct signaling timing at the receiver. With the timing information not being explicitly transmitted, the receiver must be able to extract such information from the signal received. Therefore, the receiver has a component that accomplishes such a task; this component is also referred to as clock recovery.

Providing a clock recovery for high-order modulation schemes running at speeds close to the technological edge is an emerging challenge.

In a coherent receiver, a local oscillator (LO) laser is mixed with the impinging light to produce the desired signal components. After a linear opto-electric conversion, the resulting electrical signals are forwarded to Analogue-to-Digital Converters (ADCs), which provide an input to a digital signal processing block. The ADC sampling rate must be fast enough to fulfil the sampling theorem and provide the digital receiver with sufficient information.

In contrast to the traditional receivers, which mitigate the transmission impairments by optical means, in a coherent receiver the electrical analogue signal is still affected by CD, PMD and possibly nonlinear distortion. Further, it usually exhibits a carrier frequency offset, because the LO frequency is not perfectly tuned to the optical carrier.

Traditional clock recovery for optical receivers is implemented in analogue electronics and employs a Voltage Controlled Oscillator (VCO) to adjust the sampling frequency as well as the phase. While a fully analogue implementation could fulfil the bandwidth requirements of a high-speed system, this is not feasible in a coherent receiver, because of the distortions mentioned above.

A digital implementation may advantageously compensate impairments (at least compensate the CD), but has to cope with the low processing speed of digital electronics in Very Large Scale of Integration (VLSI) circuits. Application-Specific Integrated Circuits (ASICs) are typically at least two orders of magnitude slower than high-speed optics. The slow processing speed and the resulting processing latency adversely affect the bandwidth of the clock recovery and therefore limit its ability to handle timing jitter.

Such jitter tolerance, however, is a critical requirement for any clock recovery. The tolerance limits must be compatible with the network limits for the maximum output jitter and wander according to the principle that any receiver must tolerate the imperfection of any possible relevant transmitter. For the Optical Transport Network (OTN), the minimum equipment tolerance to jitter and wander are specified in the ITU-T recommendation G.8251.

It is thus a challenge to provide a digital clock recovery that is compatible with the technological constraints of the VLSI technology and that can successfully cope with timing jitter.

The straightforward extension of the analogue clock recovery to a CP-QPSK (Coherent Polmux QPSK) receiver is a hybrid analogue-digital clock recovery as shown in FIG. 1. Here, a VCO control signal is computed by a clock recovery 105 within a digital signal processing block 108 after a compensator 103. Hence the clock recovery 105 conveys a computed signal to a DAC 106 that generates the analogue voltage 107 to drive a VCO 101. The output of the VCO 101 is used to control an ADC 102, which processes a received signal 109. The output of the ADC 102 is connected to the compensator 103. The output of the compensator 103 is conveyed to the clock recovery 105 and to an additional processing 104.

A main drawback of this hybrid architecture shown in FIG. 1 is a significant delay in the control loop introduced by the compensator 103. The delay can make the loop unstable or pose a severe limitation on the achievable bandwidth, thus jeopardizing the tolerance of the receiver to the timing jitter mentioned above.

Such delay can be avoided and at the same time the VCO may be omitted by providing a fully digital solution as shown in FIG. 2. A received signal 207 is conveyed to an ADC 201, which is driven by a free-running crystal oscillator XO 202. The output of the ADC 201 is fed to a compensator 203 and further to a clock recovery 204, which corrects timing phase and frequency by re-sampling the asynchronous digital signal. The output of the clock recovery 204 is fed to an additional processing 205. The compensator 203, the clock recovery 204 and the additional processing 205 are arranged within a digital signal processing block 206.

FIG. 3 shows a schematic diagram of a fully-digital feedback clock recovery implementation. A Phase Error Detector PED 301 measures a residual timing error on two output signals 307, 308 of a decimator 306. The residual timing error is conveyed as an error information 309 to a loop filter 302 and the output signal 310 of this loop filter 302 is forwarded to a Numerically Controlled Oscillator NCO 303, which computes a correction phase $\mu$ 311, which is fed to interpolators 304, 305, and a decimation trigger signal 312, which is fed to the decimator 306.

Signals $XI_{in}$ and $XQ_{in}$, refer to in-phase and quadrature components of a signal received. Signals $XI_{out}$ and $XQ_{out}$ refer to the same components after re-sampling and are provided for further processing.

In addition, the decimator 306 provides a signal "block_en" in case a block is valid and is not discarded. Accordingly the signal "block_en" is not set in case a block is to be decimated (discarded). It is noted that the decimator 306 operates on a block basis, wherein an ASIC comprising such decimator 306 provides a clock that allows a per-block operation.

BRIEF SUMMARY OF THE INVENTION

Re-sampling occurs at the interpolator 304, 305. To process a high-rate signal on a digital ASIC, a parallelized architecture can be used. In FIG. 3, the thick lines indicate a parallel data bus and the thin lines refer to scalar signals. A required Degree of Parallelization (DoP), i.e. the number of processed samples per clock cycle, may depend on the data rate and the ASIC technology utilized. A delay of a single ASIC clock corresponds to a delay of DoP samples and has an impact on the performance of the feedback clock recovery. Unfortunately, many retiming stages are necessary to implement the PED and the whole loop structure. Thus, the resulting loop-delay poses a severe limitation on the loop bandwidth and therefore limits the jitter tolerance. Hence, this solution is not suitable for implementing a fully digital clock recovery for high-speed communication systems.

The problem to be solved is to overcome the disadvantages mentioned above and in particular to provide an efficient solution for clock recovery that can be used for high speed communication systems.

This problem is solved according to the features of the independent claims. Further embodiments result from the depending claims.

In order to overcome this problem, a method for processing a signal in particular for clock recovery purposes is suggested,
  wherein a timing phase is determined over an observation interval of an input signal;
  wherein a frequency estimation is determined based on the timing phase;
  wherein a phase correction is determined for the observation interval based on the timing phase and the frequency estimation;
  wherein the phase correction is used to correct an interpolation phase of the input signal.

The input signal may be a digital input signal conveyed on a parallel data bus. The degree of parallelism may depend on the respective scenario. The method may be implemented on one or more units that could at least partially be part of an integrated circuit, e.g. an ASIC.

The phase correction may in particular be used to correct an interpolation phase of the input signal before it is further processed, e.g., decoded.

Hence, the solution presented enables an efficient clock recovery for high speed communication systems that compensate varying jitter as well as a frequency offset that may vary slowly compared to the jitter.

It is noted that the estimated timing phase, the frequency estimation and the phase correction are signals.

In an embodiment, the timing of the input signal is adjusted by utilizing the phase correction to adjust at least one interpolator in the path of the input signal.

In another embodiment, the timing phase is determined by averaging the timing phase over the whole observation interval comprising N blocks of parallel samples.

It is noted that the method can be processed on at least one processing unit which is (at least partially) implemented on an integrated circuit operating at a given clock rate. The clock rate of the integrated circuit determines a block rate, i.e. a parallelized amount of data is processed with each clock cycle by this integrated circuit. Each block may comprise several samples (e.g. 128 samples). The samples are provided by an ADC at the input stage of a receiver. An observation interval may span several (e.g., 5 or 6) blocks.

In a further embodiment, a frequency offset in the input signal is compensated by incrementing a phase accumulator with each clock cycle by the frequency estimation.

The clock cycle is in particular the clock cycle of the integrated circuit providing the processing capability.

The phase accumulator provides a phase that is an improved approximation of the timing phase.

In a next embodiment, the phase correction is determined by comparing the phase accumulator with a predetermined threshold.

This predetermined threshold may amount to 0.5 (in the case of two-fold oversampling).

It is also an embodiment that twofold oversampling is used and the phase correction is determined according to $$\mu_k = \begin{cases} 2\theta_k & \text{if } \theta_k < 0.5 \\ 2\theta_k - 1 & \text{if } \theta_k \geq 0.5, \end{cases}$$

with $$\theta_{k+1} = \theta_k + \Delta f$$

wherein
  $\mu$ is the phase correction;
  $\theta$ is the phase accumulator;
  $\Delta f$ is the frequency estimation;
  k is a block counter used to accumulate the samples of an observation interval.

This allows a classification of incoming samples in main and intermediate samples.

It is noted that at the beginning of the observation interval, the initial phase accumulator may be set to $$\theta_{init} = \varphi - \frac{N}{2}\Delta f,$$

with $\phi$ being the estimated average timing phase over the observation interval.

According to also an embodiment, the frequency estimate is calculated by means of a second order PLL wherein the timing phase is processed at the rate of the observation interval.

Pursuant to another embodiment, a decimation signal is generated in case an irregular order of samples is determined, i.e., when the number of intermediate samples between main samples differs for successive main samples.

According to an embodiment, a decimation signal is generated in case at least one surplus sample is determined.

According to another embodiment, the irregular order of samples or the at least one surplus sample is determined by comparing a position of main and intermediate samples in the input signal with an output signal.

In particular, the positions of main and intermediate samples in the input and output signal blocks are compared and the first sample of each output block is enforced to be a main sample.

In yet another embodiment, the output signal is calculated based on the phase correction.

Hence, the output signal can be derived based on the phase correction already calculated without having to tap, e.g., the output of the decimator.

According to a next embodiment, the main and the intermediate samples are derived from a comparison of the phase accumulator with a predefined threshold.

Pursuant to yet an embodiment, a sample is classified as a main sample in case its phase accumulator is smaller than the predefined threshold and as an intermediate sample otherwise.

According to a further embodiment, a delay period of a decimator is determined in particular by a flip-flop and wherein the flip-flop is toggled when a decimation signal is generated.

The decimator can be realized as a parallelized decimator that comprises a FIFO queue. Hence, the delay of the decimator depends on the number of queued samples. Whether the delay is even or odd and can be stored in a flip-flop. Since skipping a sample changes the length of the queue, the flip-flop can be toggled whenever a sample is discarded.

Pursuant to an embodiment, the decimation signal the decimation signal is suppressed if the time that has passed since the last decimation event is shorter than a predefined period of time.

Hence, a hysteresis is implemented avoiding that decimation signals are produced in fast succession.

According to another embodiment, the subsequent (new) phase correction is not used and the previous phase correction is used if the decimation signal is suppressed.

Hence, also a hysteresis is implemented with regard to using the phase correction. If the predefined period of time has not passed, the previous phase correction may be maintained and no update to the actual phase correction is conducted.

According to yet an embodiment, said predefined period of time since the last decimation event occurred is based on $$\Delta f \cdot T_d \geq THR_d,$$

wherein $T_d$ is the period of time since the previous decimation event occurred;

$THR_d$ is a given threshold;

$\Delta f$ is the frequency estimation.

The given threshold $THR_d$ may be a positive value smaller than 1.

According to a further embodiment, the input signal comprises at least one quadrature signal component and at least one in-phase signal component.

It is noted that in particular several quadrature (Q) and/or in-phase (I) signal components could be utilized.

As indicated above, the method described can be used for a clock recovery. It may be run on an integrated circuit, e.g., an ASIC; the method may in particular be run on one or several components (functional blocks) of such integrated circuit. It is in particular noted that at least one step of the method described herein may be conducted on a functional block of an ASIC. The method may be run on a communication device, in particular a receiver. The communication device may be connected to a high speed optical network.

The problem stated above is also solved by a device comprising or being associated with at least one processing unit that is arranged such that the method as described herein is executable thereon.

It is noted that the steps of the method stated herein may be executable on this/these processing unit(s) as well.

It is further noted that said processing unit can comprise at least one, in particular several means that are arranged to execute the steps of the method described herein. The means may be logically or physically separated; in particular several logically separate means could be combined in at least one physical unit.

Said processing unit may comprise at least one of the following: a processor, a microcontroller, a hard-wired circuit, an ASIC, an FPGA, a logic device.

The device may be a receiver, a component of a communication system or a portion thereof.

Furthermore, the problem stated above is solved by a communication system comprising at least one device as described herein.

Embodiments of the invention are shown and illustrated in the following figures:

DESCRIPTION OF THE INVENTION

The approach presented in particular suggests a fully-digital feed-forward clock recovery for continuous transmission at high data rates. The design presented is able to achieve a high jitter tolerance independently of the ratio between the line rate and the clock speed of the digital implementation.

Figure 1:
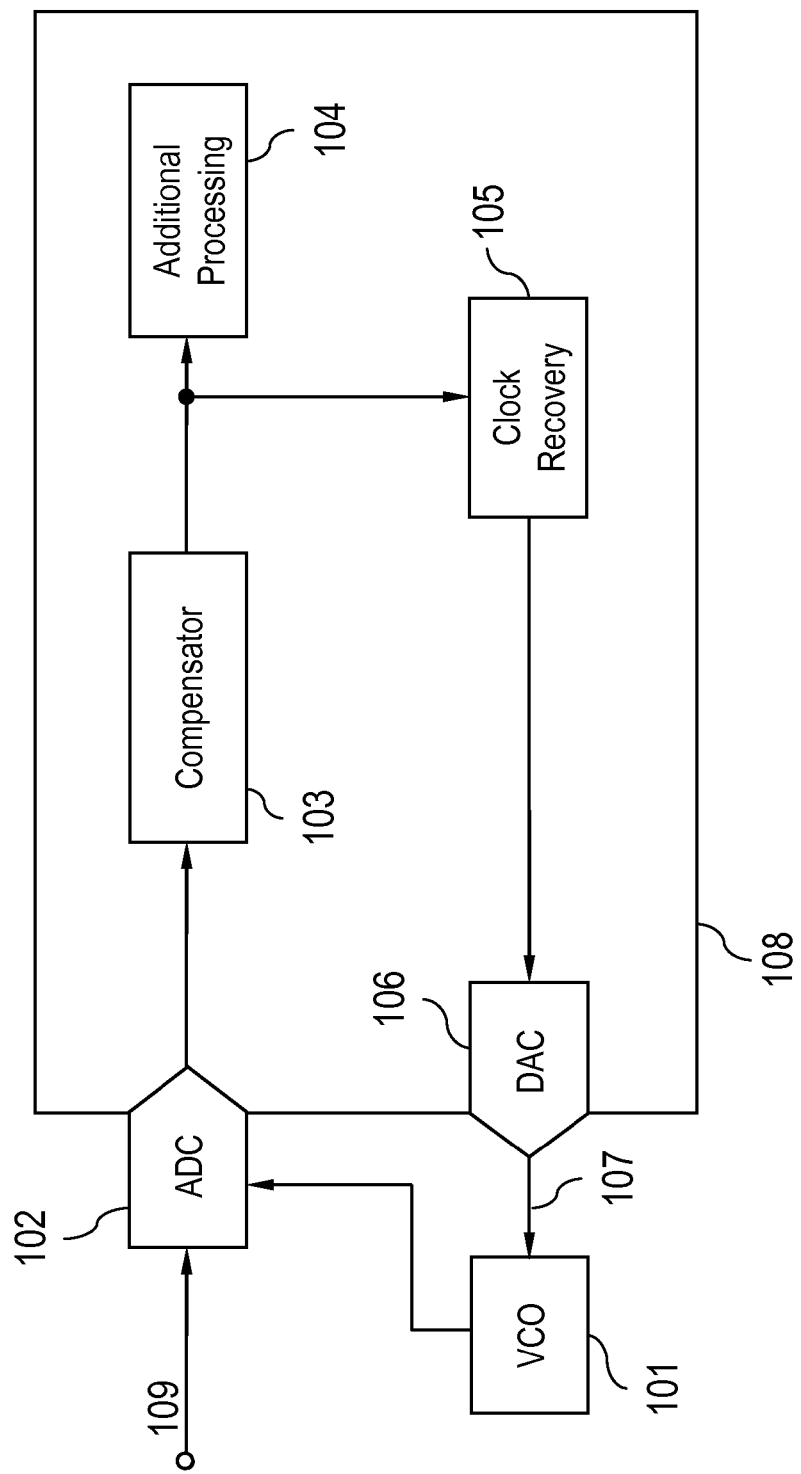
FIG. 1 shows a conventional hybrid analogue-digital clock recovery system.
Figure 2:
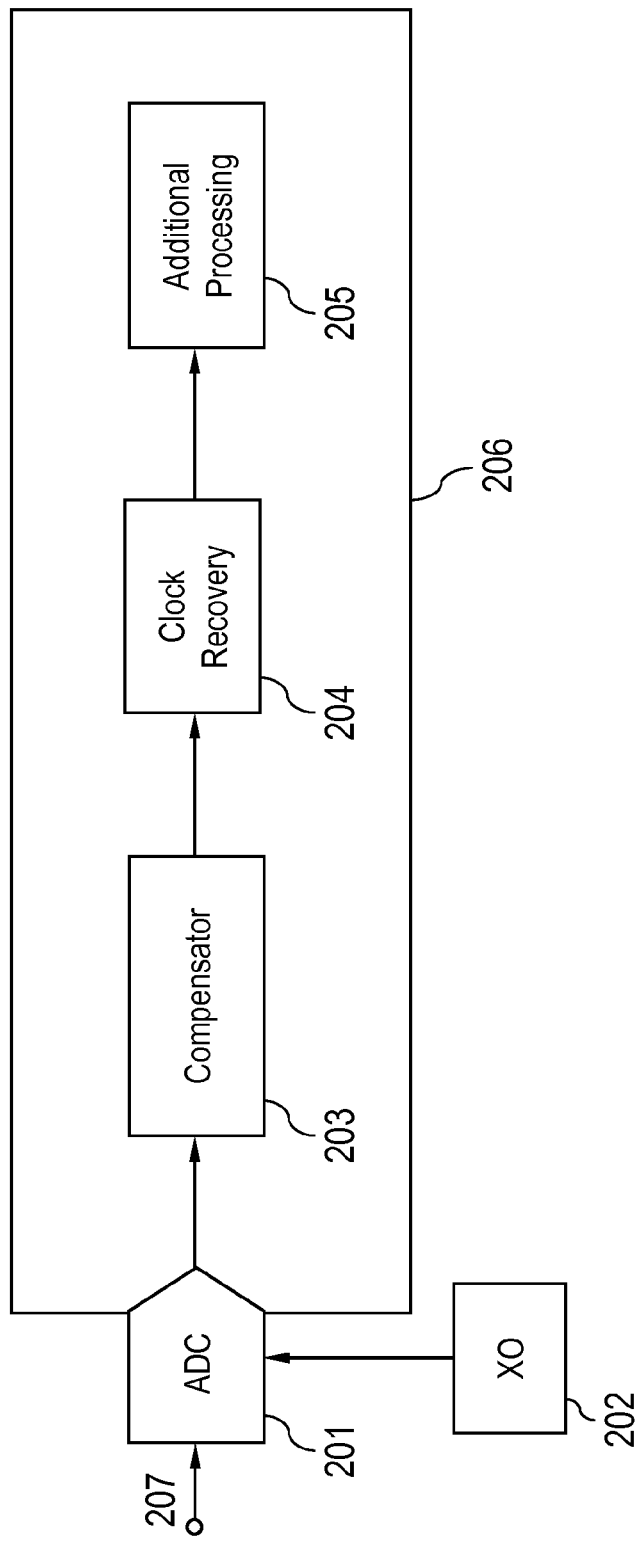
FIG. 2 shows a conventional digital clock recovery system.
Figure 3:
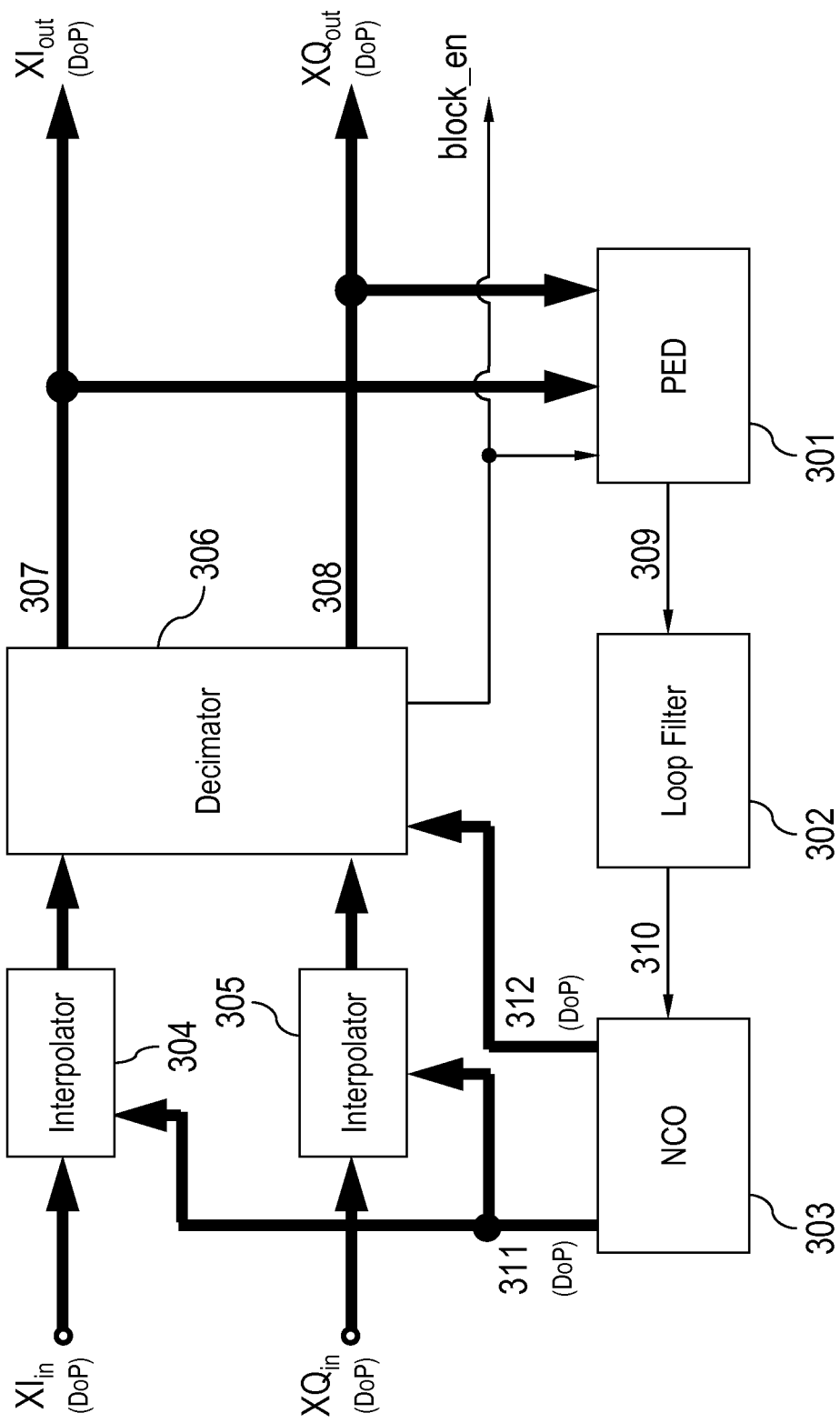
FIG. 3 shows a conventional fully digital feedback clock recovery implementation.
Figure 4:
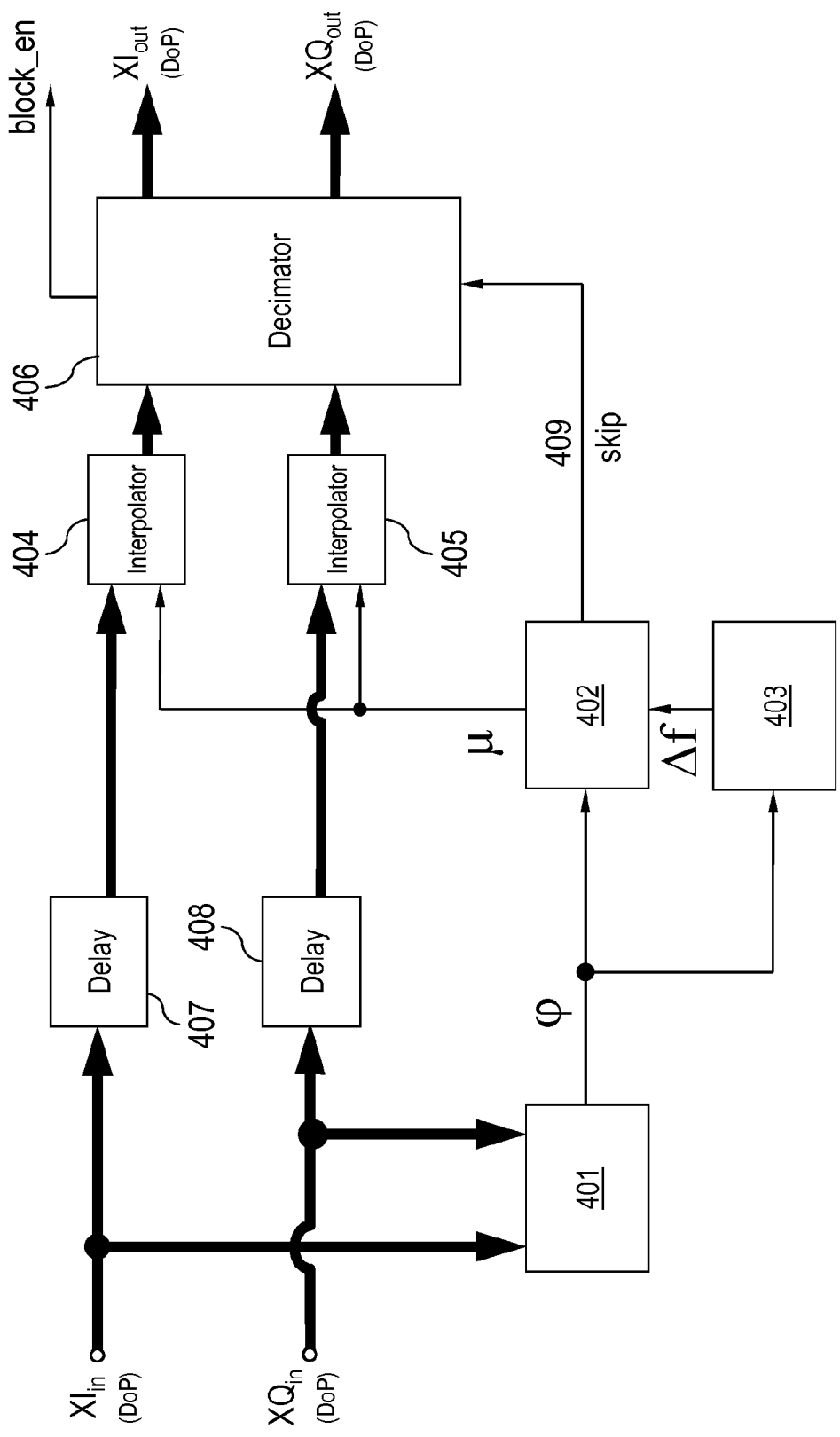
FIG. 4 shows a schematic block structure illustrating a feed-forward solution of a clock recovery.

FIG. 4 shows a schematic block structure illustrating a feed-forward solution. Signals $XI_{in}$ and $XQ_{in}$, refer to in-phase and quadrature components of a signal received. Signals $XI_{out}$ and $XQ_{out}$ refer to the same components after re-sampling and are provided for further processing. A thick line indicates a parallel data bus of DoP samples and a thin line indicates a connection for serial signals.

The signal $XI_{in}$ is fed to a delay unit 407 and to a timing phase estimator 401. The signal $XQ_{in}$ is fed to a delay unit 408 and to the timing phase estimator 401. The output of the delay unit 407 is connected to an interpolator 404 and the output of the delay unit 408 is connected to an interpolator 405. The output of the interpolator 404 and the output of the interpolator 405 are connected to a decimator 406. The decimator 406 provides the output signals $XI_{out}$ and $XQ_{out}$ after clock recovery for further processing.

The timing phase estimator 401 assesses an optimal timing phase over an observation interval (OI) comprising N blocks of DoP samples. The timing phase is conveyed to an interpolation phase computer 402 and to a frequency estimator 403.

The frequency estimator 403 determines a frequency estimation $\Delta f$, which is conveyed to the interpolation phase computer 402. The interpolation phase computer 402 determines a phase correction $\mu$ that is fed to the interpolator 404 and to the interpolator 405.

In contrast to existing feed-forward solutions, a frequency offset is determined or estimated. The frequency estimation Δf is then used to
(1) compute a phase correction μ along the OI and
(2) avoid wrong decimation events (skip signal, see below).

The phase correction μ and a prevention of false decimation event are provided by the interpolation phase computer 402. A decimation trigger signal 409 (also referred to as skip signal) is fed from the interpolation phase computer 402 to the decimator 406.

The delay units 407, 408 compensate for the processing latency and assure that the re-sampling signals are applied to the samples that have been used for their computation.

The decimator 406 provides a signal "block_en" in case a block is valid and is not discarded. Accordingly the signal "block_en" is not set in case a block is to be decimated (discarded). It is noted that the decimator 406 operates on a per-block basis, i.e. an ASIC comprising the structure shown in FIG. 4 provides a clock that allows such a per-block operation. For example, an OI may comprise 5 or 6 blocks and each block may comprise 128 samples provided by an ADC.

Figure 5:
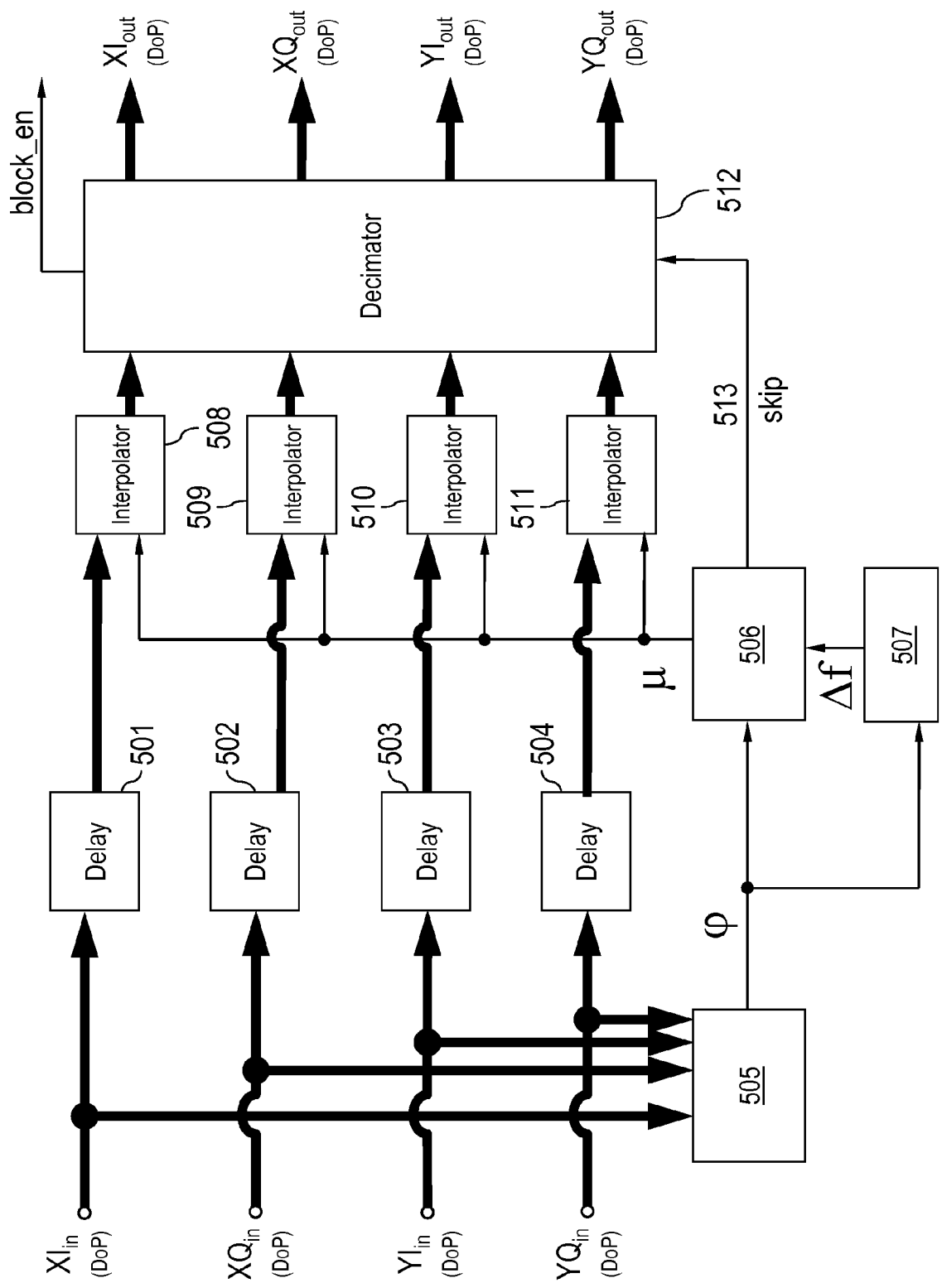
FIG. 5 shows an example of a polarization-multiplexed (polMux) transmission comprising four input signals, i.e. $XI_{in}$, $XQ_{in}$, $YI_{in}$ and $YQ_{in}$.

This clock recovery scheme can be generalized for multiple-input multiple-output systems. FIG. 5 shows an example of a polarization-multiplexed (polMux) transmission comprising four input signals, i.e. $XI_{in}$, $XQ_{in}$, $YI_{in}$ and $YQ_{in}$, wherein X and Y refer to two orthogonal polarizations, I refers to the in-phase component and Q refers to the quadrature component.

Each input signal $XI_{in}$, $XQ_{in}$, $YI_{in}$ and $YQ_{in}$ is fed to a delay unit 501 to 504 and to a timing phase estimator 505. The timing phase estimator 505 provides a timing phase φ to an interpolation phase computer 506 and to a frequency estimator 507. The frequency estimator 507 determines a frequency estimation Δf and conveys it to the interpolation phase computer 506, which determines a phase correction μ that is fed to interpolators 508 to 511 and a skip signal 513 that is fed to a decimator 512. The output of the delay unit 501 is connected to the interpolator 508, the output of the delay unit 502 is connected to the interpolator 509, the output of the delay unit 503 is connected to the interpolator 510 and the output of the delay unit 504 is connected to the interpolator 511. The interpolators 508 to 511 are connected via their respective outputs to the decimator 512. The decimator 512 supplies output signals $XI_{out}$, $XQ_{out}$, $YI_{out}$ and $YQ_{out}$.

A thick line indicates a parallel data bus of DoP samples and a thin line indicates a connection for serial signals.

With regard to timing phase estimators for blind feed-forward clock-recovery, reference is made to an overview presented in [T. Fusco and M. Tanda, "Blind Feedforward Symbol-Timing Estimation With PSK Signals: A Constant-Modulus Approach", IEEE Trans. Comm., vol. 55, no. 2, pp. 242-246, February 2007].

Advantageously, the clock recovery suggested is compatible with any such phase estimator.

Figure 6:
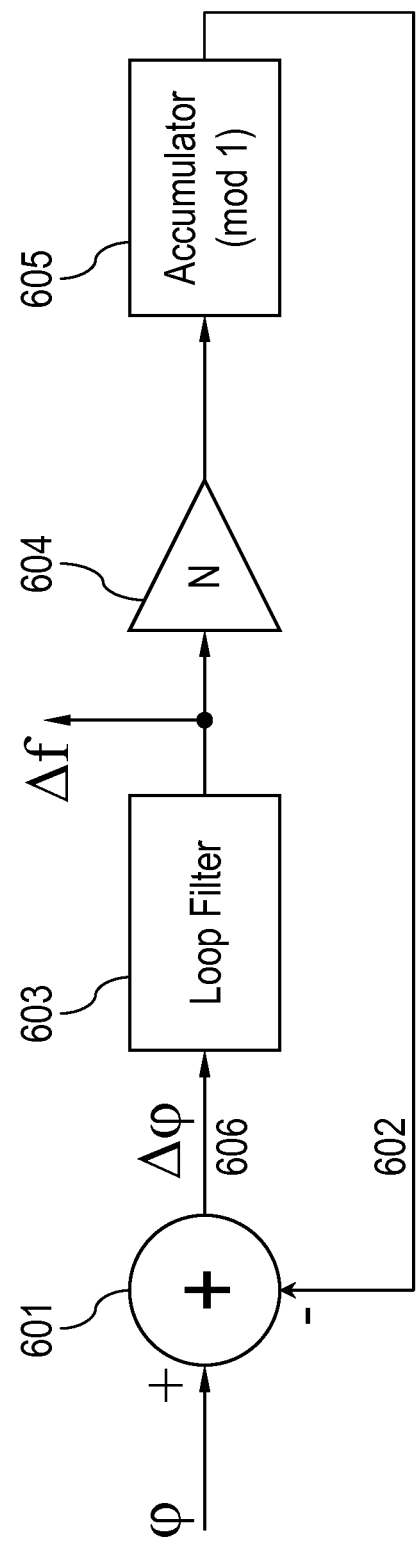
FIG. 6 shows a schematic diagram illustrating an exemplary implementation of the frequency estimator as shown in FIG. 4 or FIG. 5.

FIG. 6 shows a schematic diagram illustrating an exemplary implementation of the frequency estimator 403, 507. The timing phase φ is fed to a combiner or adder 601, which subtracts from it a signal 602. The output of the adder 601 provides a timing phase difference signal Δφ 606 to a loop filter 603, which produces a frequency estimation Δf (see also FIG. 7). The frequency estimation Δf is also conveyed to a multiplier 604, where it is multiplied with the number of N (ASIC) clock cycles within the observation interval. The output of the multiplier 604 is connected to an accumulator 605, which corresponds to a digital implementation of an integrator. The output of the accumulator 605 provides said signal 602 that is fed to the adder 601.

In this regard, FIG. 6 shows a 2nd order Phase Locked Loop (PLL) operating on scalar signals. The PLL is run once per observation interval, i.e. once every N ASIC clock cycles. For moderate to large values of N, a delay-free implementation might be used.

Figure 7:
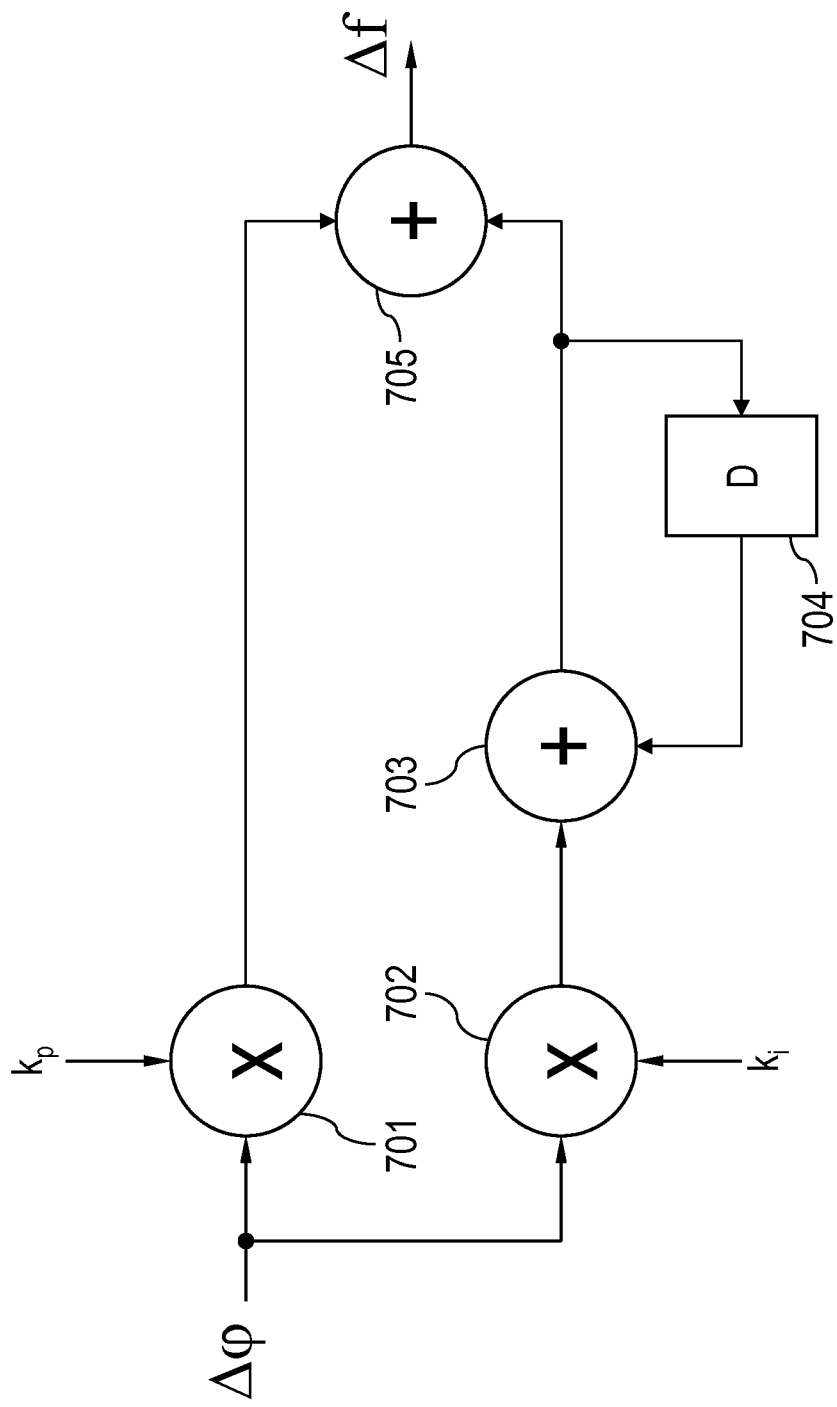
FIG. 7 shows a schematic block diagram of an exemplary implementation of the loop filter as shown in FIG. 6.

The loop filter 603 can be realized as a Proportional-Integral (PI) filter with a proportional gain $k_p$ and an integral gain $k_i$. FIG. 7 shows a schematic block diagram of an exemplary implementation of such loop filter 603. Hence, the timing phase difference signal Δφ 606 is fed to a multiplier 701 and to a multiplier 702. At the multiplier 701, the signal Δφ 606 is multiplied with the proportional gain $k_p$ and at the multiplier 702, the signal Δφ 606 is multiplied with the integral gain $k_i$. The output of the multiplier 701 is conveyed to an adder 705. The output of the multiplier 702 is conveyed to an adder 703 and the output of the adder 703 is conveyed to the adder 705 and to a delay unit 704. The output of the delay unit 704 is conveyed to the adder 703. At the output of the adder 705, the frequency estimation Δf is provided.

By the frequency estimators 403, 507 both the input phase and the accumulated phase are mapped to an interval [0; 1[, i.e. are expressed in 2π radians. The phase difference signal Δφ 606 is mapped to an interval [−0.5; 0.5[, in order to encode the error direction directly in the sign information. A phase unwrapping may not be required, because in tracking mode the phase difference is deemed to be very small (i.e., Δφ<<1).

The loop is analyzed using the following transfer functions (in z-transform notation)

$$H_\varphi(z) \equiv \frac{\Delta\Phi}{\Phi} = \frac{(1-z^{-1})^2}{(1-z^{-1})^2 + 2N\zeta\omega_n(1-z^{-1}) + N^2\omega_n^2} \quad (1)$$

and $$H_f(z) \equiv \frac{\Delta F}{\Phi} = \frac{2\zeta\omega_n(1-z^{-1})^2 + N\omega_n^2(1-z^{-1})}{(1-z^{-1})^2 + 2N\zeta\omega_n(1-z^{-1}) + N^2\omega_n^2} \quad (2)$$

with $$k_p = 2\zeta\omega_n \quad (3)$$
$$k_i = \omega_n^2 N,$$

wherein $k_i$ is the integral gain of the PI-filter (see loop filter 603 and FIG. 7);

$k_p$ is the proportional gain of the PI-filter (see loop filter 603 and FIG. 7);

N denotes the number of (ASIC-) clock cycles within the OI;

$\omega_n$ denotes a natural frequency.

In an analogue approximation, a damping factor amounts to and an equivalent noise bandwidth amounts to $$B_{n,an} = \frac{\omega_n}{2}\left(\zeta + \frac{1}{4\zeta}\right)\frac{f_s}{DoP}. \quad (4)$$

wherein $f_s$ is a sampling frequency of an ADC that is arranged prior to the input of the feed-forward clock recovery as suggested.

In the presence of a frequency offset corresponding to a timing phase increment of $\Delta f_0$ 2π radians per parallel block, the input phase φ has the shape of a ramp and its z-transform amounts to $$\Phi(z) = \frac{N\Delta f_0}{(1-z^{-1})^2}, \quad (5)$$

wherein a normalization by N is based on the fact that the loop runs at the rate of the OI rather than at the rate of the ASIC clock.

By virtue of the final value theorem follows $$\lim_{n\to\infty} \Delta\varphi[n] = \lim_{z\to 1}(1-z^{-1})\Delta\Phi(z) \quad (6)$$
$$= \lim_{z\to 1}(1-z^{-1})H_\varphi(z)\Phi(z)$$
$$= 0$$

and $$\lim_{n\to\infty} \Delta f[n] = \lim_{z\to 1}(1-z^{-1})\Delta F(z) \quad (7)$$
$$= \lim_{z\to 1}(1-z^{-1})H_f(z)\Phi(z)$$
$$= \Delta f_0.$$

Therefore, in the steady state and in the absence of phase jitter, the output of the phase subtractor (adder 601) approaches zero and the frequency estimation Δf the loop filter 603 equals the frequency offset, i.e. the timing phase increment per parallel block.

Any phase jitter present on the received signal or produced by the phase estimator 404, 505 is transferred according to equation (1) and equation (2). In particular, an impact of a high-frequent jitter on Δφ and Δf is weighted by $$H_\varphi(z = e^{j\pi}) = \frac{4}{4+4N\omega_n\zeta + N^2\omega_n^2} \quad (8)$$

and $$H_f(z = e^{j\pi}) = \frac{2(4\omega_n\zeta + N\omega_n^2)}{4+4N\omega_n\zeta + N^2\omega_n^2}, \quad (9)$$

respectively.

Hence, the frequency estimation Δf may provide a very stable estimate of the frequency offset, which is virtually independent of the timing jitter.

The proposed interpolation phase computer 402, 506 uses the timing phase φ and the frequency estimation Δf to compute the parameters for the re-sampling block, i.e. the parameters used by the interpolators 404, 405, 508 to 511 and the decimator 406, 512. Hence, the interpolation phase computer 402, 506 provides three functionalities:

1. Correction of the frequency offset based on the frequency estimation Δf;
2. Computation of the interpolation phase (i.e. provide phase correction μ);
3. Generation of the decimation signal (skip signal to be conveyed to the decimator).

The timing phase estimator 401, 505 computes a new timing phase φ at each OI. This timing phase φ is averaged over a whole observation interval comprising N blocks of DoP samples. If a frequency offset is present, the timing phase φ varies linearly in time and the estimated timing phase φ is optimal only in the middle of the OI. Depending on the length of the OI, the timing phase φ can differ significantly at the edges of the OI from an actual timing phase.

The interpolation phase computer 402, 506 compensates this effect by using the frequency estimation Δf. An internal phase accumulator θ is initialized at the beginning of the OI at $$\theta_{init} = \varphi - \frac{N}{2}\Delta f \quad (10)$$

and then incremented at each subsequent ASIC clock cycle by the frequency estimation Δf:

$$\theta_{k+1} = \theta_k + \Delta f. \quad (11)$$

The phase θ is a better approximation than the phase φ, because it is averaged only over the DoP samples of a parallel block rather than over the entire OI.

The second task of the interpolation phase computer 402, 506 is determining the interpolation phase μ (also referred to as phase correction) from the estimated timing phase θ. If, e.g., two-fold oversampling is assumed, the sampling phase p traverses an interval [0; 1[ twice while the estimated timing phase e traverses it once. The interpolation phase is computed from the timing phase as follows:

$$\mu_k = \begin{cases} 2\theta_k & \text{if } \theta_k < 0.5 \\ 2\theta_k - 1 & \text{if } \theta_k \geq 0.5. \end{cases} \quad (12)$$

By comparing the timing phase θ with the threshold 0.5 incoming samples at the ADC rate can be classified as into main and intermediate samples. Hence, if θ is smaller than 0.5 the first sample of the parallel block can be considered as a main sample. If θ is larger than or equal to 0.5, it can be regarded as an intermediate sample. Without transmission impairments, the main samples are interpolated to the instants of maximal eye opening.

By effect of the frequency offset, the status of the first sample in the arriving parallel blocks toggles between main and intermediate. The interpolation phase computer 402, 506 may control the status of the first sample in the output blocks by generating a decimation signal. If the decimation rate equals exactly the frequency offset, the position of main and intermediate samples in the output blocks remains constant.

The interpolation phase computer 402, 506 accomplishes its third task, i.e. the generation of the decimation or skip signal 409, 513, by comparing the position of main and intermediate samples in the input and output signal blocks and by enforcing the first sample of each output block to be a main one.

The status of the incoming samples can be directly derived from equation (12). To enforce the status of the output samples, the interpolation phase computer 402, 506 needs to know the delay of the re-sampling block. Since a parallelized decimator 409, 512 comprises a First-In-First-Out (FIFO) queue, its delay depends on the number of queued samples. From the perspective of the interpolation phase computer 402, 506, the only relevant information is whether the delay is even or odd and can be stored in a flip-flop. Since skipping a sample changes the length of the queue, the flip-flop is toggled whenever a sample is discarded.

The variance of the phase estimation affects the phase φ and the phase θ and therefore also the decimation signal 409, 513. In consequence of an estimation error, the decimation signal can be set too early or too late. A delayed decimation does not have any special effects other than those intrinsic in the estimation variance. On the contrary, an early decimation might trigger a second decimation at the next available possibility, i.e. at the following OI. The second decimation restores the correct sequence of main and intermediate samples but results in a cycle slip.

The probability of such an event may become significant if the OI is too short and the estimation variance is poor. To obviate this issue, a hysteresis could be introduced in the decimation decision by exploiting the stability of the frequency estimation. Hence, a decimation is allowed only if a time $T_d$ has passed since the last decimation event occurred according to the following inequality $$\Delta f \cdot T_d \geq \text{THR}_d, \quad (13)$$

wherein $\text{THR}_d$ is a positive threshold smaller than 1. If the time $T_d$ is too short, the phase estimation could be deemed wrong; hence, the decimation trigger and the new interpolation phase μ are disregarded. In such case, the re-sampling unit could be fed with the previous value of the interpolation phase. If the time $T_d$ is long enough, the decimation signal and the new interpolation phase are accepted and utilized.

Large values of the hysteresis threshold $\text{THR}_d$ increase a protection against wrong decimation events and thus cycle slips. However, due to input timing jitter, the separation between two true decimation events may be shorter than $1/\Delta f$. The hysteresis threshold $\text{THR}_d$ shall thus be chosen in such a way that no true decimation events are discarded.

In the presence of a frequency offset $\Delta f_0$ and a sinusoidal jitter of peak-peak amplitude $A_{j,pp}$ and frequency $f_j$ the timing phase evolves as $$\Delta(t) = 2\pi \Delta f_0 t + \pi A_{j,pp} \sin(2\pi f_j t + \beta_0) + \alpha_o. \quad (14)$$

The time $T_d$ between two successive (true) decimation events fulfils the condition $$\Delta f T_d + \frac{A_{j,pp}}{2} \sin(2\pi f_j T_d + \beta_0) - \frac{A_{j,pp}}{2} \sin(\beta_0) = 1. \quad (15)$$

The maximum hysteresis threshold $\text{THR}_d$ can be determined numerically by computing (over any possible phase $\beta_0$) the minimum time between two decimation events.

The choice of the observation interval implies a trade-off between estimation accuracy and sensitivity to phase jitter.

Recalling the evolution of the timing phase in the presence of frequency offset and sinusoidal jitter pursuant to equation (14), a systematic peak-peak estimation error over an OI can be determined according to $$\varphi_{err,pp} = 2\pi \frac{\Delta f_0}{f_s} \cdot DoP + 2\pi A_{J,pp} \cdot \begin{cases} \sin\left(\pi \frac{f_J}{f_s} L\right) & \text{if } f_J < \frac{f_s}{2L} \\ 1 & \text{otherwise,} \end{cases} \quad (16)$$

with $$L = N \cdot DoP, \quad (17)$$

wherein $f_s$ is the ADC sampling frequency.

The first term in equation (16) is based on the frequency offset. Because of the frequency correction, this term is proportional to the DoP but not to the length of the OI. The second term in equation (16) results from averaging the phase estimation over the whole OI (L samples at the sampling frequency $f_s$). During the OI, an estimation error varies from $-0.5\varphi_{err,pp}$ to $0.5\varphi_{err,pp}$.

As the length of the OI increases, the estimation error in the presence of wideband jitter degrades. The estimation error in a highband region remains constant, because the jitter is faster than the clock recovery and may not be compensated in any case. The performance of the subsequent receiver components determines the amount of tolerable estimation error.

The exact limit on the OI length depends on the performance of the phase estimator and on the signal distortion at the input of the clock recovery.

The approach presented thus suggests an efficient clock recovery utilizing a timing frequency estimation to correct the interpolation phase and may in particular define a hysteresis mechanism to prevent undue (or wrong) decimation events.

The frequency correction allows using longer OIs and improving the phase estimate.

The hysteresis process controlling the decimator relies on the (very stable) frequency estimation and prevents the occurrence of catastrophic (even if sporadic) cycle slips, which affect a conventional feed-forward clock recovery operating on a continuous signal.

LIST OF ABBREVIATIONS

ADC Analog-to-Digital Converter
ASIC Application-Specific Integrated Circuit
BPSK Binary Phase-Shift Keying
CD Chromatic Dispersion
CP-QPSK Coherent Polmux-QPSK
DAC Digital-to-Analogue Converter
DGD Differential Group Delay
DoP Degree of Parallelization
FIFO First-In First-Out
I In-phase (signal component)
LO Local Oscillator
NCO Numerically Controlled Oscillator
OI Observation Interval
OOK On-Off Keying
OSNR Optical Signal-to-Noise Ratio
OTN Optical Transport Network
PE Phase Estimator
PED Phase Error Detector
PI Proportional-Integral (filter)
PLL Phase Locked Loop
PMD Polarization Mode Dispersion
polMux Polarization Multiplexing
Q Quadrature (signal component)
QPSK Quaternary Phase-Shift Keying
UI Unit Interval
VCO Voltage Controlled Oscillator
VLSI Very Large Scale of Integration
XO Crystal Oscillator

The invention claimed is:

1. A method of processing a signal, the method comprising:
   determining a timing phase for a series of blocks of samples, wherein the series of blocks of samples spans an observation interval of an input signal;
   determining a frequency estimation based on the timing phase determined for the series of blocks of samples;
   determining a phase correction for each cycle within the observation interval that is a linear function of time with a slope being proportional to the frequency estimation so that the phase correction corresponds to said timing phase around the center of the observation interval; and
   adjusting a timing of the input signal by using the phase correction.

2. The method according to claim 1, wherein the step of adjusting the timing of the input signal comprises utilizing the phase correction to adjust at least one interpolator in a path of the input signal.

3. The method according to claim 1, wherein the step of determining the timing phase comprises averaging the timing phase over the entire observation interval comprising N blocks of parallel samples.

4. The method according to claim 1, wherein the step of determining the phase correction comprises comparing the phase accumulator with a predetermined threshold.

5. The method according to claim 1, which comprises utilizing twofold oversampling and determining the phase correction according to $$\mu_k = \begin{cases} 2\theta_k & \text{if } \theta_k < 0.5 \\ 2\theta_k - 1 & \text{if } \theta_k \geq 0.5, \end{cases}$$

with $$\theta_{k+1} = \theta_k + \Delta f$$

wherein
μ is the phase correction;
θ is the phase accumulator;
Δf is the frequency estimation; and
k is a block counter used to accumulate the samples of an observation interval.

6. The method according to claim 1, which comprises calculating the frequency estimate by way of a second order PLL wherein the timing phase is processed at the rate of the observation interval.

7. The method according to claim 1, which comprises generating a decimation signal in case an irregular order of samples is determined.

8. The method according to claim 1, which comprises generating a decimation signal in case at least one surplus sample is determined.

9. The method according to claim 1, which comprises determining an irregular order of samples or at least one surplus sample is determined by comparing a position of main and intermediate samples in the input signal with an output signal, and generating a decimation signal in case an irregular order of samples is determined or in case at least one surplus sample is determined.

10. The method according to claim 9, which comprises calculating the output signal based on the phase correction.

11. The method according to claim 9, which comprises deriving the main and the intermediate samples from a comparison of the phase accumulator with a predefined threshold.

12. The method according to claim 11, which comprises classifying a sample as a main sample in case a phase accumulator thereof is smaller than the predefined threshold and classifying the sample as an intermediate sample otherwise.

13. The method according to claim 7, which comprises determining a delay period of a decimator by a flip-flop and toggling the flip-flop when a decimation signal is generated.

14. The method according to claim 7, which comprises suppressing the decimation signal if a time that has passed since the last decimation event is shorter than a predefined period of time.

15. The method according to claim 14, which comprises not using a new phase correction and instead using a previous phase correction if the decimation signal is suppressed.

16. The method according to claim 14, wherein the predefined period of time since the last decimation event occurred is based on $$\Delta f \cdot T_d \geq \text{THR}_d,$$

wherein
$T_d$ is the period of time since the previous decimation event occurred;
$\text{THR}_d$ is a given threshold; and
Δf is the frequency estimation.

17. The method according to claim 1, wherein the input signal comprises at least one quadrature signal component and at least one in-phase signal component.

18. A communication system, comprising at least one device selected from the group consisting of an integrated circuit, an ASIC, a receiver, a component of a communication system, and a portion thereof, configured to execute thereon the method according to claim 1.

19. A device, comprising:
a timing phase estimator adapted to determine a timing phase for a series of blocks of samples, wherein the series of blocks of samples spans an observation interval of an input signal;
a frequency estimator adapted to determine a frequency estimation based on the timing phase determined for the series of blocks of samples;
an interpolation phase computer adapted to determine a phase correction for each cycle within the observation interval that is a linear function of time with a slope being proportional to the frequency estimation so that the phase correction corresponds to said timing phase around the center of the observation interval; and
an interpolator adapted to adjust a timing of the input signal by using the phase correction.

20. The device according to claim 19, configured as integrated circuit, an ASIC, a receiver, a component of a communication system, or a portion thereof.

21. The device according to claim 19, further comprising a phase accumulator adapted to be incremented with each clock cycle by the frequency estimator such as to compensate a frequency offset.

* * * * *